United States Patent [19]
Curran

[11] Patent Number: 6,104,212
[45] Date of Patent: *Aug. 15, 2000

[54] COMMON DOMINO CIRCUIT EVALUATION DEVICE

[75] Inventor: Brian William Curran, Saugerties, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/021,868

[22] Filed: Feb. 11, 1998

[51] Int. Cl.[7] ...................... H03K 19/096; H03K 19/094
[52] U.S. Cl. ................................. 326/95; 326/83; 326/112
[58] Field of Search ................................. 326/95, 98, 83, 326/86, 112, 106, 121, 119

[56] References Cited

U.S. PATENT DOCUMENTS

| 4,710,650 | 12/1987 | Shoji ........................................ 326/98 |
| 5,402,012 | 3/1995 | Thomas ..................................... 326/97 |
| 5,440,243 | 8/1995 | Lyon ......................................... 326/33 |
| 5,532,625 | 7/1996 | Rajivan ..................................... 326/98 |
| 5,815,005 | 9/1998 | Bosshart ................................... 326/95 |

OTHER PUBLICATIONS

"A Dynamic Energy Recycling Logic Family for Ultra Low Power Gigascale Integration (GSI)" by V. K. De and J. D. Meindl, Aug. 1996, IEEE Abstract Only.

"Skew–Tolerant Domino Circuits" by David Harris and Mark A. Horowitz, IEEE Journal of Solid–State Circuits, vol. 32, No. 11, Nov. 1997, pp. 1702–1711.

"Dynamic Circuit Implementation for Control Logic" IBM Technical Disclosure Bulletin, by Borkenhagen, vol. 36, No. 11, Nov. 1993, pp. 281–284.

"Asymmetric Transition Dual–Rail Signalling" IBM Technical Disclosure Bulletin, by M. E. Dean, vol. 37, No. 01, Jan. 1994, pp. 69–84.

"P–OR Domino Gate" IBM Technical Disclosure Bulletin, By G. F. Grohoski et al., vol. 38, No. 06, Jun. 1995, pp. 509–510.

"CMOS World Line Decoder for Dense Semiconductor Memories" IBM Technical Disclosure Bulletin, by. G. F. Diniz et al., vol. 38, No. 08. Aug. 1995, pp. 569–574.

"Domino Clocking Scheme to Reduce Clock Loads" IBM Technical Disclosure Bulletin, by R. P. Singh, vol. 39, No. 08, Aug. 1996, pp. 215–216.

*Primary Examiner*—Michael Tokar
*Assistant Examiner*—James H. Cho
*Attorney, Agent, or Firm*—Lynn L. Augspurger

[57] ABSTRACT

A domino CMOS circuit has a number of domino gates, a common virtual ground node and a common evaluation NFET device. Each domino gate provides a PFET precharge device, an NFET device tree, an output inverter stage, a dynamic node, a plurality of input nodes, a clock input node and an output node. The PFET precharge device is coupled to a high voltage supply rail, the clock input node and the dynamic node and an NFET device tree is coupled to the common virtual ground node, to the plurality of inputs and to the dynamic node. An output inverter stage is coupled to the high voltage supply rail, to said dynamic node, to a low voltage supply rail and to said output node. And for improving performance, a common evaluation NFET device is coupled to said clock inputnode, to the to said low voltage supply rail and to the common virtual ground node. The virtual ground node is coupled to the low voltage supply rail when a high voltage is applied to clock input node.

17 Claims, 4 Drawing Sheets

COMMON DOMINO CIRCUIT EVALUATION DEVICE

FIELD OF THE INVENTION

This invention is related to domino circuits and particularly to a common domino circuit evaluation device useful for high-frequency microprocessor designs using domino circuits.

BACKGROUND OF THE INVENTION

Domino circuits are commonly used in high-frequency microprocessor designs because the propagation delay through a domino circuit is generally less than the propagation delay through a functionally-equivalent complementary static circuit. However, domino circuits introduce several complications. Each domino gate requires a clocked PFET precharge device to precharge the gates internal dynamic node to a high voltage potential. A high DC current can result during precharge as illustrated by FIG. 1 when the PFET precharge device and the series NFET devices in the NFET tree are simultaneously conducting. Typically, a clocked NFET evaluation or foot device is added to each domino gate to break the conduction path during precharge (See U.S. Pat. No. 5,532,625 issued Jul. 2, 1996 to Sun Microsystems' S. Rajivan). Such a device prevents excessive DC current and speeds up the precharge of the dynamic node as shown in FIG. 1. However, this evaluation device adds one more NFET device to the NFET stack which increases the resistance of the dynamic node to ground discharge path resulting in greater propagation delay through the domino gate. The evaluation device also introduces greater clock load and higher chip power.

SUMMARY OF THE INVENTION

The drawbacks of the evaluation device are greatly reduced by providing a common evaluation device shared by all domino gates within a circuit. Just as in prior art, the common evaluation device breaks the conduction path during precharge. However, the common evaluation device width is larger than the prior-art evaluation device and thus provides a much lower resistance conduction path and less degradation of domino gate speed.

These and other improvements are set forth in the following detailed description. For a better understanding of the invention with advantages and features, refer to the description and to the drawings.

(Note: For convenience of illustration, FIGURES may be separated in parts and as a convention we place the top circuit illustrated by the FIGURE as the first sheet, with subsequent sheets proceeding down and across when viewing the FIGURE, in the event that multiple sheets are used.)

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to examine a few observations about a circuit which comprises a collection of domino gates. After the internal dynamic node of a domino gate is precharged the node may be discharged provided the gate inputs to the NFET tree switch to a high voltage potential as to provide a conduction path from the dynamic node to ground. A discharge of the dynamic node causes the gates output to switch to a high voltage potential which may in turn cause a discharge of the dynamic node in other gates. This process is often referred to as toppling. In general not all domino gates will topple every clock cycle. (In a large circuit with many domino gates, typically half of the gates will topple.) Also, not all domino gates will topple simultaneously. Clearly any gate with inputs driven by a 'previous stage' domino gate cannot topple or evaluate until the 'previous stage' gate was toppled. This is illustrated in FIG. 2 where gate 2 cannot evaluate until gate 1 has evaluated.

An improvement of the prior art is a circuit which comprises a collection of domino gates each of which is connected to one large (i.e. wide) evaluation device. This large device offers lower resistance to ground and thus faster propagation delay for the domino gates within the circuit. Also the width of this large device can be smaller than the sum of the widths of the individual evaluation devices in the prior art. This reduces clock load and clock power dissipation.

Figure 1:
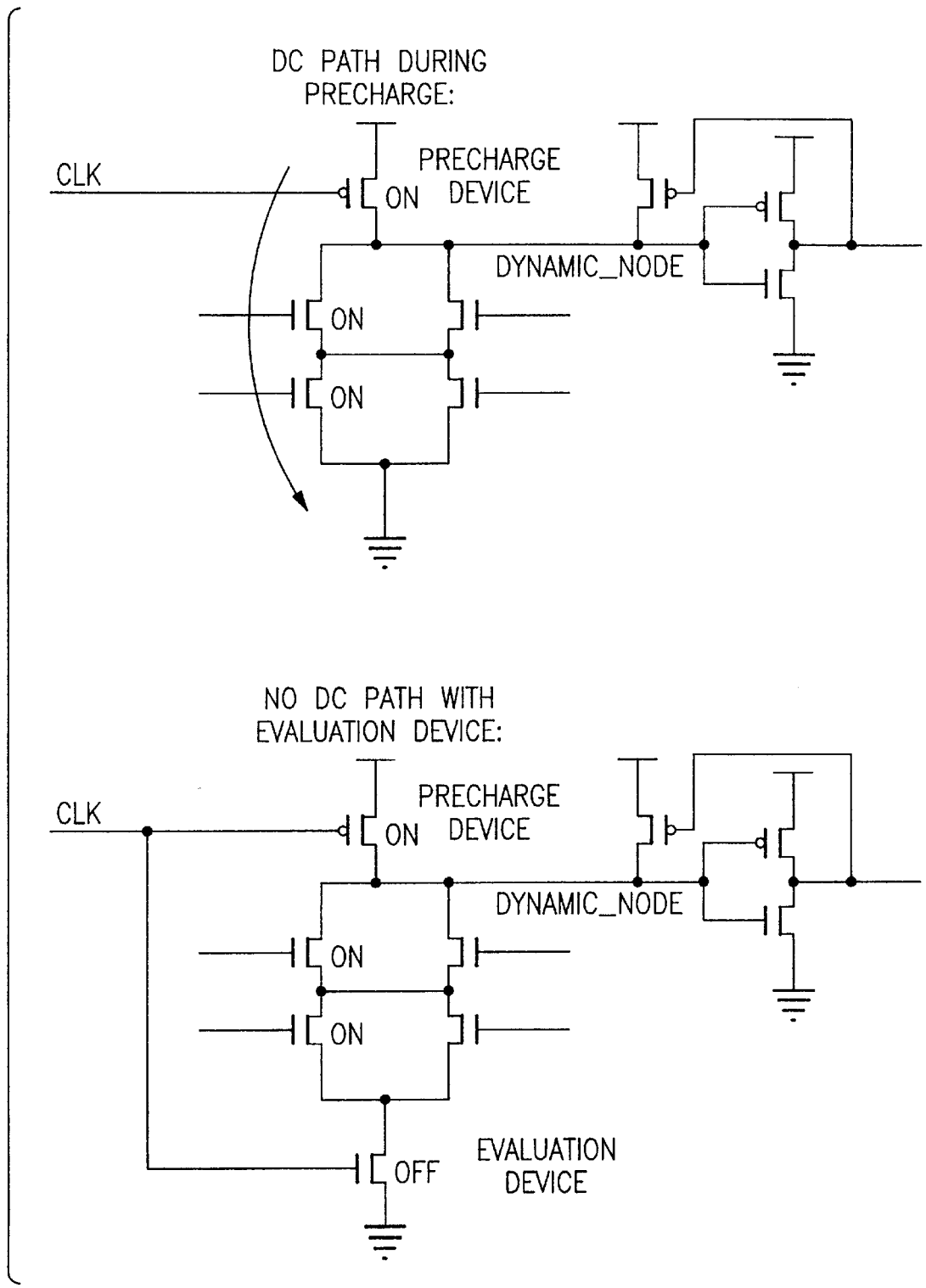
FIG. 1 shows schematically a domino gate without an NFET evaluation device and a domino gate with an NFET evaluation device during precharge operation.
Figure 2:
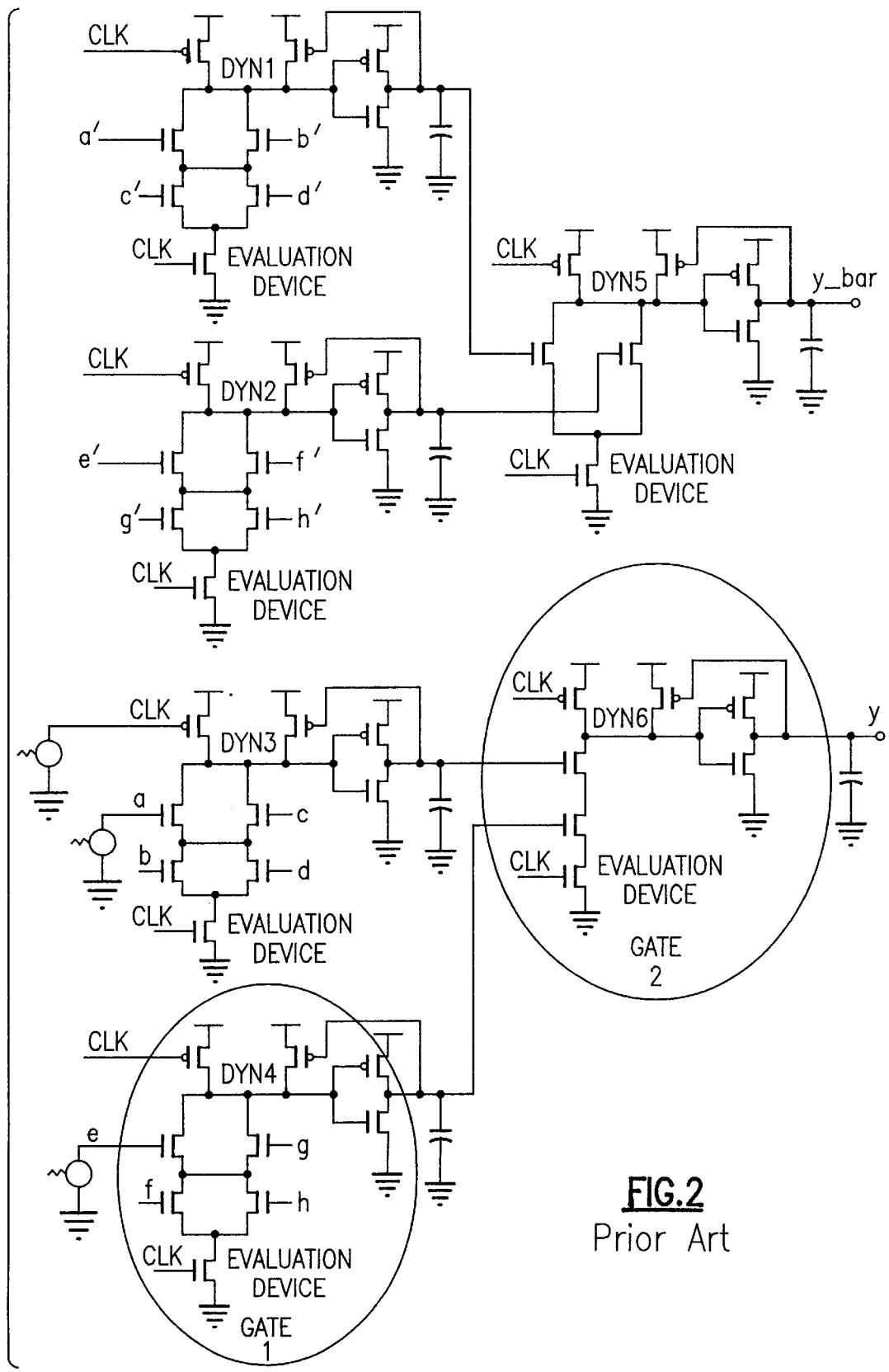
FIG. 2 shows schematically a prior art domino circuit with individual evaluate devices for each gate.
Figure 3:
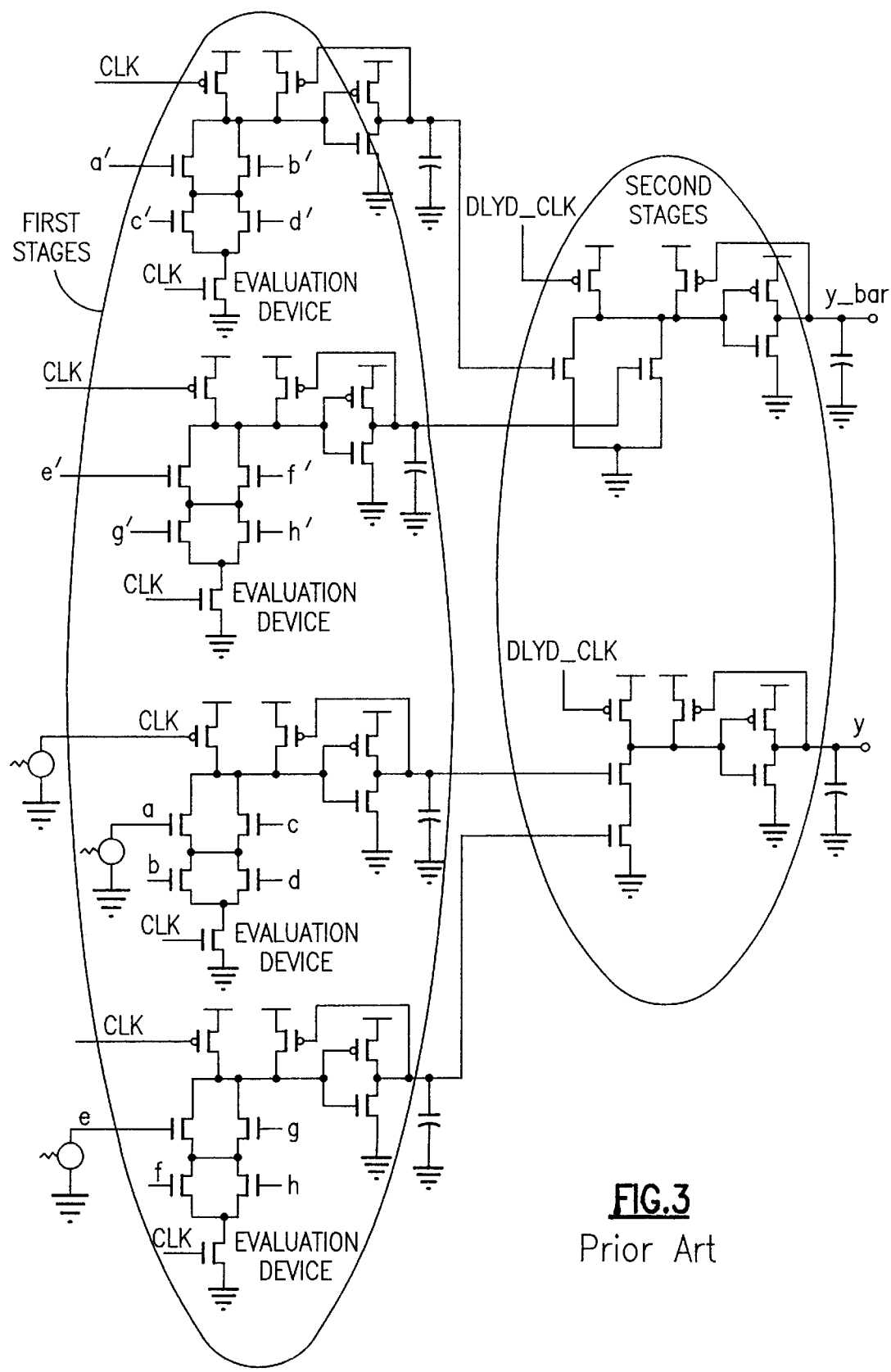
FIG. 3 shows schematically a prior art delayed precharge domino circuit.

A prior art circuit with individual evaluate devices for each domino gate is shown in FIG. 2. The primary inputs to the circuit are connected to the inputs of the first domino stages. The outputs of the first domino stages are connected to the inputs of the second domino stages. One prior art solution to the increased series resistance of the NFET evaluation device just described is the delayed precharge domino circuit illustrated in FIG. 3. Evaluation devices are included for only the first stages in the circuit. The second stages in the circuit are precharged with a delayed clock such that the inputs to the second stage are reset to a low voltage state before the internal dynamic nodes of the second stages are precharged to a high voltage. This avoids the collision condition where the NFET tree is pulling the dynamic node to a low voltage potential while the PFET precharge device is pulling the dynamic node to a high voltage potential. The DC paths from Vdd to ground in the second stages are thus avoided. This solution introduces significant complexity in the clock distribution however, since multiple clocks must be generated, routed and connected to the first and second domino stages. Removing the NFET evaluation device for the third (fourth, . . . ) domino stage would require a third (fourth, . . . ) clock, further increasing the distribution and connection complexity. Also it is non-trivial to generate these delayed clocks with sufficient precision as to avoid collisions yet guarantee that the gates within a domino stage is properly reset before a subsequent evaluation of the gates starts to occur.

Figure 4:
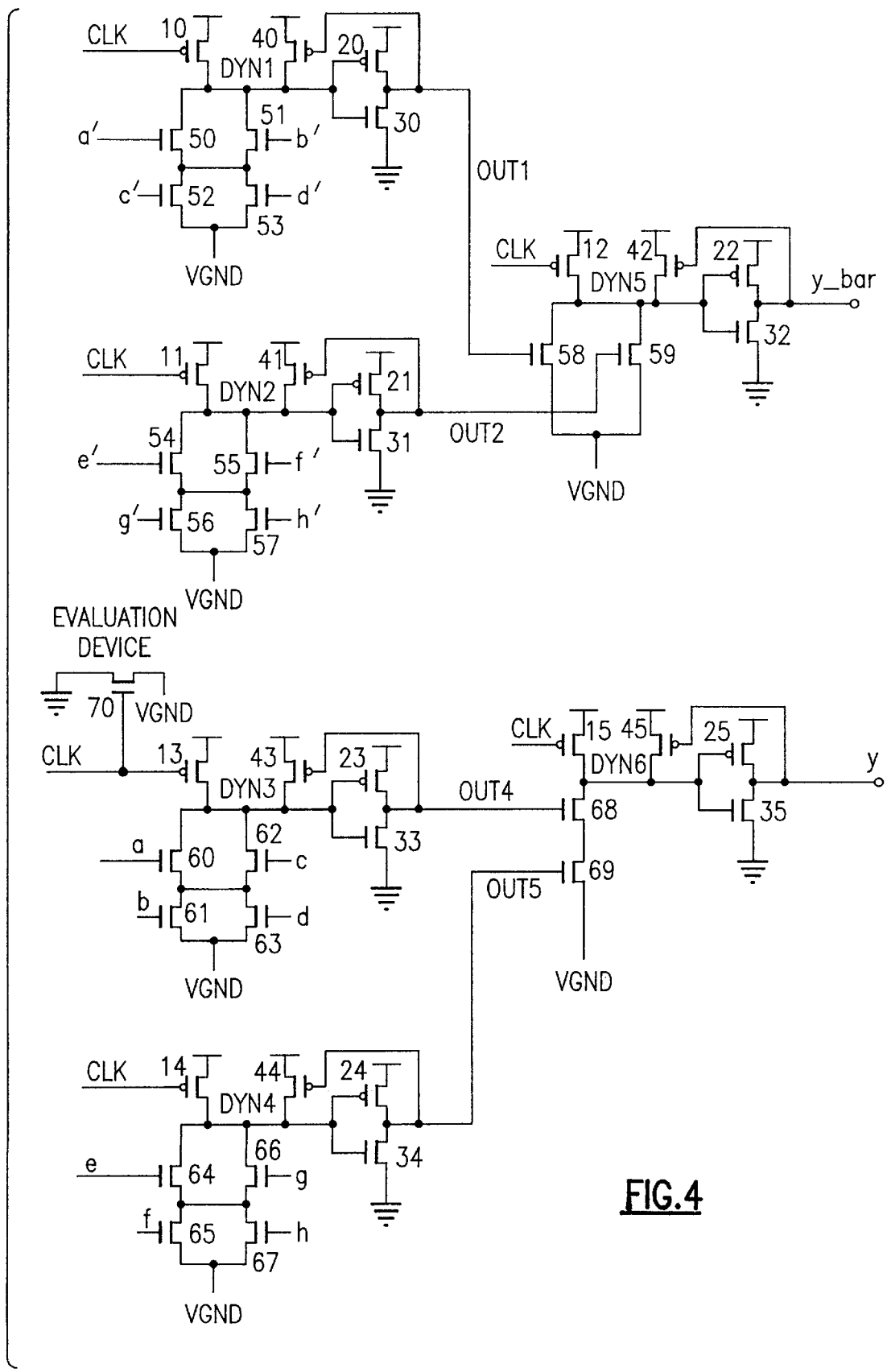
FIG. 4 shows schematically the preferred embodiment of the subject circuit with a single large, shared evaluation device.

The preferred embodiment for a common evaluate circuit is illustrated in FIG. 4. All data inputs to circuit: a, b, c, d, e, f, g, h, a', b', c', d', e', f', g' and h' are initially driven to a low voltage (i.e. ground potential.) The circuit which generates inputs a and a' can never drive inputs a and a' to a high voltage level at the same time. Similarly inputs b and b' can never be simultaneously driven to a high voltage level; (etc.) The clock input is also initially driven to a low voltage which causes precharge PFETs 10, 11, 12, 13, 14 and 15 to conduct. The internal dynamic nodes, dyn1, dyn2, dyn3, dyn4, dyn5 and dyn6 are thus precharged to a high voltage (Vdd) as current from Vdd supply flows through precharge PFETs. Also note that when clock input is at ground potential the common evaluation device 70 is turned OFF and the conduction path from node vgnd to ground supply rail is broken. This prevents DC current flow from the dynamic nodes through NFET trees (NFET devices 50 and 52 for example). NFETs 30, 31, 32, 33, 34, and 35 conduct and pull domino gate output nodes out1, out2, $y_{13}$ bar, out4, out5 and y to ground potential. These output nodes in turn cause PFET half latch devices 40, 41, 42, 43, 44, 45 and 46 to conduct. Next, the clock input is driven to a high voltage which turns off precharge PFETs 10, 11, 12, 13, 14, and 15. The dynamic nodes dyn1, dyn2, dyn3, dyn4, dyn5 and dyn6 are now held to high voltage state via half latch devices 40, 41, 42, 43, 44 and 45. These half latch devices are optional; when present they are typically weak devices to ensure that the dynamic nodes can be discharged to ground through the NFET trees. When not present, the dynamic nodes may be inadvertently discharged through various sources of noise within the circuit or inputs to the circuit. A complete description of these noise sources is not required to understand the operation of the common evaluation device circuit. Also when clock input is driven to a high voltage the common evaluation device 70 is turned ON which causes node vgnd to be discharged to ground. A voltage potential is thus established between the dynamic nodes and node vgnd. If inputs a' and c' switch to a high voltage level, NFETs 50 and 52 begin to conduct and dynamic node dyn1 is discharged to ground potential through node vgnd and common evaluation device 70. If inputs a' and d' switch to a high voltage level, NFETs 50 and 53 begin to conduct which also discharges node dyn1 to ground potential. Similarly, if inputs b' and c' or if inputs b' and d' switch to a high voltage level, node dyn1 is discharged to ground potential. The NFET tree consisting of NFETs 50, 51, 52, and 53 thus implements the function F=(a' OR b') AND (c' OR d').

Note that node vgnd is heavily loaded by the wire capacitance and junction capacitance of the large number of NFETs connected to the node. Those skilled in the art of high-frequency circuit design avoid designing nodes with large capacitance. However, this is an exception to that rule. Fastest circuit performance is obtained when the dynamic node is quickly discharged. When NFET tree devices turn ON a charge sharing occurs whereby the charge on dynamic node dyn1 is redistributed (or shared) with charge on node vgnd. A high capacitance vgnd node causes more initial charge to be removed from dynamic node. A sufficiently large removed charge can cause the dynamic node voltage to drop below the threshold voltage of the output inverter and hence cause the gate to topple or evaluate well before the common NFET evaluation device 70 begins to conduct. Eventually, all residual charge on the dynamic node and node vgnd will be discharged to ground potential as the common NFET evaluation device begins conduction. When multiple domino gate topple simultaneously some degradation in delay occurs. To minimize the degradation, the common NFET evaluation device should be properly sized such at the device can conduct the charge being conducted onto the node vgnd by the discharging of the multiple dynamic nodes.

As node dyn1 discharges to ground potential, NFET 30 turns OFF and PFET 20 begins to conduct which causes output node out1 to charge to a high voltage level. This in turn causes NFET 58 to conduct which causes dynamic node dyn5 to discharge to ground potential through node vgnd and common evaluation device 70. NFET 32 turns OFF and PFET 22 begins to conduct which causes output node $y_{13}$ bar to charge to a high voltage level.

Due to the sequential nature of the domino gate connections, dynamic nodes dyn1 and dyn5 can never be discharged simultaneously. The sequential connections of the domino gates also prevents dynamic nodes dyn2 and dyn5 from discharging simultaneously, dynamic nodes dyn3 and dyn6 from discharging simultaneously and the dynamic nodes dyn4 and dyn6 from discharging simultaneously. Due to the complementary structure of the domino gates and complementary nature of inputs a, a' and of inputs b, b', etc. dynamic nodes dyn1 and dyn3 can never be discharged simultaneously. Note the NFET tree consisting of NFETs 60, 61, 62 and 63 implements the function F'=(a AND b) OR (c AND d) which is the complement of the function F=(a' OR b') AND (c' OR d') implemented by NFETs 50, 51, 52 and 53. Similarly dynamic nodes dyn2 and dyn4 can not discharged simultaneously because the functions implemented by their respective NFET trees are complementary. Similarly, nodes dyn5 and dyn6 can not discharge simultaneously. This is an important observation since the common evaluation device 70 needs to be designed to only sink the instantaneous currents from the six domino gates within the circuit. In worst case only two of the six dynamic nodes may be simultaneously discharging to ground. In the prior-art domino circuit each domino gate has own evaluation device which must be designed to sink current from one dynamic node.

As an example consider prior-art circuit with 6 individual 10 micron wide evaluation devices. The common evaluation device circuit with a single 60 micron wide evaluation device presents same load on clock input. However, at most two dynamic nodes will discharged simultaneously through this common evaluation device and thus it effectively provides a path with ⅓ the resistance of the prior art circuit. Lower path resistance results in faster discharge of the dynamic nodes and faster domino gate speeds. Alternatively, the common evaluation device width may be set to 20 microns which would provide a discharge path with same resistance as prior art. The major advantage of the 20 micron device is the significant reduction in clock load. One can trade off faster propagation delay with lower clock power in a continuous way by increasing or decreasing the width of the common evaluation device. Choosing a common evaluation device width between 20 and 60 microns would reduce clock load and improve domino gate speed.

As a result of the work I have described it can be seen that the preferred embodiment for a common domino evaluate circuit provides improved circuit performance while simultaneously reducing clock power. Clock power is the major contributor to chip power in microprocessors with high domino circuit usage. The common evaluation device circuit solution is also superior to prior art delayed precharge circuits in both the above metrics yet does not require the complex clock generation and distribution of the prior art solution.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A CMOS circuit comprising:
   a plurality of more than two domino gates, a common virtual ground node and characterized by a common evaluation NFET device, and further characterized in that each said domino gate of said plurality of more than two domino gates respectively comprises a PFET precharge device, and an NFET device tree, and an output inverter stage, and a dynamic node, and a plurality of input nodes, and a clock input node and an output node; and wherein each domino gate receives unique inputs and an output node of a first domino gate of one of said plurality of domino gates is coupled to an input node of a next respective domino gate of said plurality of more than two domino gates to establish a sequential domino gate connection among said plurality of more than two domino gates with a first dynamic node in the first domino gate of said one of said plurality of domino rates discharging before the discharge of the dynamic node of the next domino gate; and said PFET precharge device of each said domino gate is coupled to a high voltage supply rail, and to said clock input node and said dynamic node of each said domino gate;

said NFET device tree of each said domino gate being coupled to said common virtual ground node for said plurality of domino gates, and to said plurality of inputs and to said dynamic node;

said output inverter stage coupled to said high voltage supply rail, to said dynamic node, to a low voltage supply rail and to said output node;

said common evaluation NFET device coupled to said clock input node, to said low voltage supply rail and to said common virtual ground node whereby said common evaluation NFET device for all of said plurality of more than two domino gates is shared by all domino gates within the circuit.

2. The circuit according to claim 1 wherein said virtual ground node is coupled to said low voltage supply rail when a high voltage is applied to said clock input node.

3. The circuit according to claim 2 wherein said dynamic nodes of said plurality of domino gates are precharged to said high voltage supply rail when a low voltage is applied to said clock input node.

4. The circuit according to claim 3 wherein said output nodes of said plurality of domino gates are coupled to said low voltage supply rail when said dynamic node is precharged to said high voltage supply rail.

5. The circuit according to claim 4 wherein a dynamic node of one of said plurality of domino gates is discharged by coupling of said dynamic node to said virtual ground node when high voltage is applied to said plurality of input nodes.

6. The circuit according to claim 5 wherein said output node of one of said plurality of domino gates is coupled to said high voltage supply rail when said dynamic node is discharged to said low voltage supply rail.

7. The circuit according to claim 6 wherein an output node of said first domino gate is coupled to an output node of a next domino gate with serialized gate evaluations by said shared common evaluation NFET device required because the former first domino gate's output is an input to the next domino gate said first domino gate evaluates before the next domino gate can evaluate.

8. The circuit according to claim 7 wherein a virtual ground node of said first domino gate is coupled to a virtual ground node of said second domino gate.

9. The circuit according to claim 8 wherein said common evaluation NFET device is coupled to said virtual ground node of said first domino gate and to said virtual ground node of second domino gate and with the serial nature of the domino gate connections the dynamic nodes at most two of said domino gates discharge to ground simultaneously.

10. A CMOS circuit comprising:

a plurality of more than two domino gates and a common virtual ground node, characterized by each gate receiving unique inputs for implementing a unique function and each said domino gate of said plurality of more than two domino gates comprises a PFET precharge device, an NFET device tree, an output inverter stage, a dynamic node, a plurality of input nodes, a clock input node and an output node;

and wherein each domino gate receives unique inputs and an output node of a first domino gate of one of said plurality of domino gates is coupled to an input node of a next respective domino gate of said plurality of more than two domino gates to establish a sequential domino gate connection among said plurality of more than two domino gates with a first dynamic node in the first domino gate of said one of said plurality of domino gates discharging before the discharge of the dynamic node of the next domino gate; and said PFET precharge device of each said domino gate is coupled to a high voltage supply rail, to said clock input node and to said dynamic node;

said NFET device tree of each said domino gate is coupled to said common virtual ground node, to said plurality of input nodes and to said dynamic node;

said output inverter stage is coupled to said high voltage supply rail, to said dynamic node, to a low voltage supply rail and to said output node; and an evaluation NFET device is coupled to said clock input node, to said low voltage supply rail and to said common virtual ground node whereby said evaluation NFET device is shared by all domino gates within the circuit.

11. The circuit according to claim 10 wherein said virtual ground node is coupled to said low voltage supply rail when a high voltage is applied to said clock input node.

12. The circuit according to claim 11 wherein said dynamic nodes of said plurality of domino gates are precharged to said high voltage supply rail when a low voltage is applied to said clock input node.

13. The circuit according to claim 12 wherein said output nodes of said plurality of domino gates are coupled to said low voltage supply rail when said dynamic node is precharged to said high voltage supply rail.

14. The circuit according to claim 13 wherein said dynamic node of one of said plurality of domino gates is discharged by coupling of said dynamic node to said virtual ground node when a high voltage is applied to said plurality of inputs.

15. The circuit according to claim 14 wherein said output node of one of said plurality of domino gates is coupled to said high voltage supply rail when said dynamic node is discharged to said low voltage supply rail.

16. The circuit according to claim 15 wherein an output node of said first domino gate is coupled to an output node of a next domino gate with serialized gate evaluations by said shared common evaluation NFET device required because the former first domino gate's output is an input to the next domino gate said first domino gate evaluates before the next domino gate can evaluate.

17. The circuit according to claim 16 wherein virtual ground node of first domino gate is coupled to a virtual ground node of a next domino gate and with the serial nature of the domino gate connections the dynamic nodes at most two of said domino gates discharge to ground simultaneously.

* * * * *